US012805415B2

(12) United States Patent

Shi et al.

(10) Patent No.: US 12,805,415 B2

(45) Date of Patent: Nov. 17, 2026

(54) TWO-IN-ONE LEAD FRAME PACKAGE

(71) Applicant: Littelfuse Semiconductor (Wuxi) Co., Ltd., Wuxi (CN)

(72) Inventors: Lei Shi, Wuxi (CN); Jifeng Zhou, Wuxi (CN)

(73) Assignee: Littelfuse Semiconductor (Wuxi) Co., Ltd., Wuxi (CN)

(*) Notice: Subject to any disclaimer, the term of this patent is extended or adjusted under 35 U.S.C. 154(b) by 483 days.

(21) Appl. No.: 18/231,861

(22) Filed: Aug. 9, 2023

(65) Prior Publication Data

US 2024/0071878 A1 Feb. 29, 2024

(30) Foreign Application Priority Data

Aug. 24, 2022 (CN) ......................... 202211020599.6

(51) Int. Cl.

| | |
|---|---|
| ***H10W 90/00*** | (2026.01) |
| ***H10W 70/40*** | (2026.01) |
| *H10W 72/00* | (2026.01) |
| *H10W 72/60* | (2026.01) |
| *H10W 74/10* | (2026.01) |

(52) U.S. Cl.

CPC ........ *H10W 90/811* (2026.01); *H10W 70/429* (2026.01); *H10W 90/00* (2026.01); *H10W 70/417* (2026.01); *H10W 72/07653* (2026.01); *H10W 72/646* (2026.01); *H10W 74/114* (2026.01); *H10W 90/766* (2026.01)

(58) Field of Classification Search

CPC ................................................ H01L 23/49541

USPC ........................................................ 257/676

See application file for complete search history.

(56) References Cited

U.S. PATENT DOCUMENTS

2003/0222338 A1* 12/2003 Wallace .............. H10W 90/811 257/691

2011/0140262 A1* 6/2011 Lee ..................... H10W 90/811 257/E23.101

FOREIGN PATENT DOCUMENTS

EP 2477223 A2 7/2012

EP 2930747 A1 10/2015

JP 2010034350 A * 2/2010

OTHER PUBLICATIONS

European Search Report for EP Application No. 23193021.5, dated Feb. 1, 2024, 9 pages.

* cited by examiner

*Primary Examiner* — Ajay Arora

(74) *Attorney, Agent, or Firm* — KDW Firm PLLC

(57) ABSTRACT

A lead frame package includes a first semiconductor chip, a second semiconductor chip, and a first lead frame. The first semiconductor chip is connected to a die attachment pad using a first clip. The second semiconductor chip is connected to the die attachment pad using a second clip. The die attachment pad is sandwiched between the first semiconductor chip and the second semiconductor chip. The first lead frame is connected to the die attachment pad.

11 Claims, 6 Drawing Sheets

300

300

600

TWO-IN-ONE LEAD FRAME PACKAGE

CROSS REFERENCE TO RELATED APPLICATION

This application claims the benefit of priority to, Chinese Patent Application No. 2022110205996, filed Aug. 24, 2022, entitled “Two-In-One Lead Frame Package,” which application is incorporated herein by reference in its entirety.

FIELD OF THE DISCLOSURE

Embodiments of the present disclosure relate to transient voltage suppression devices and, more particularly, to package for the devices.

BACKGROUND

Transient voltage suppression (TVS) diodes are electronic components designed to protect sensitive electronics from high voltage transients. TVS diodes can respond to over-voltage events faster than most other types of circuit protection devices and are available in a variety of surface mount and through-hole circuit board mounting formats. TVS diodes are generally used to protect against electrical overstress such as those induced by lightning strikes, inductive load switching, and electrostatic discharge (ESD) associated with transmission on data lines and electronic circuits.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a lead frame package in accordance with the present disclosure may include a first semiconductor chip, a second semiconductor chip, and a first lead frame. The first semiconductor chip is connected to a die attachment pad using a first clip. The second semiconductor chip is connected to the die attachment pad using a second clip. The die attachment pad is sandwiched between the first semiconductor chip and the second semiconductor chip. The first lead frame is connected to the die attachment pad.

An exemplary embodiment of a method in accordance with the present disclosure may include three dispensing and two attaching operations. A high-temperature attachment material (HTAM) is dispensed onto a first side of a die attachment pad of a lead frame package. A first chip is attached to the first side, and the HTAM affixes the first chip to the die attachment pad. The HTAM is dispensed onto the first chip. The HTAM is dispensed onto a first lead portion and the first clip is attached between the first chip and the first lead portion, with the HTAM affixing the first clip to the first chip and the first lead portion.

DETAILED DESCRIPTION

Multiple embodiments of lead frame packages are disclosed. The two-in-one design of these packages enhances the power density of the protection device by supporting two semiconductor devices in one package. Different combinations of semiconductors are possible and allow two-channel design for the package. Clips holding the semiconductor chips may be attached using high-temperature attachment material or low-temperature attachment material, of which there are several choices for each. The lead frame packages may have two leads or three lead frames, with one of the lead frames being attached to the die attachment pad. The lead frames may be of the surface mount or dual inline package types.

For the sake of convenience and clarity, terms such as “top”, “bottom”, “upper”, “lower”, “vertical”, “horizontal”, “lateral”, “transverse”, “radial”, “inner”, “outer”, “left”, and “right” may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1A:
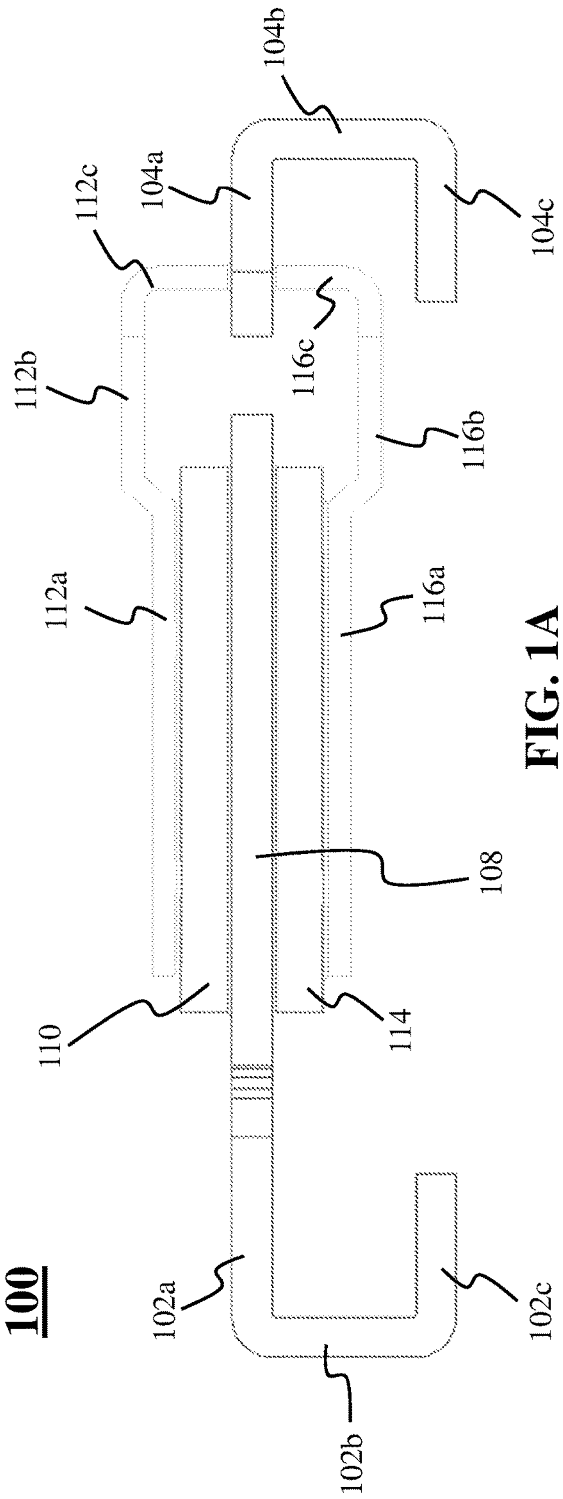
FIGS. 1A-1B are diagrams illustrating a lead frame package, in accordance with exemplary embodiments.
Figure 1B:
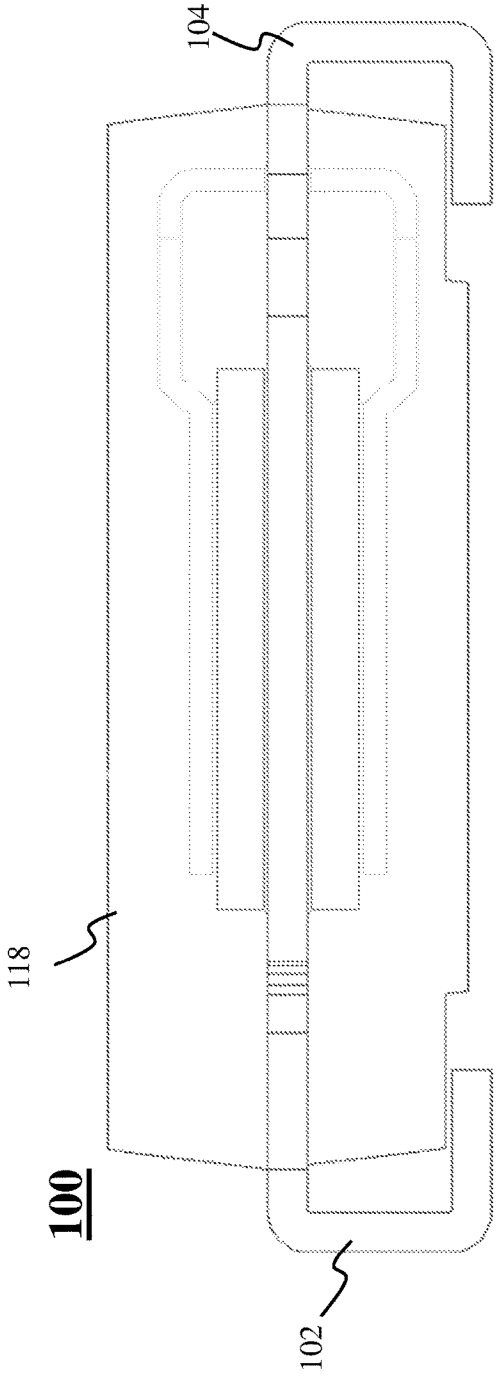

FIGS. 1A-1B are representative drawings of a lead frame package 100 for a transient voltage suppression (TVS) diode or other semiconductor device, according to exemplary embodiments. FIG. 1A is a side view of the lead frame package 100 and FIG. 1B is a side view of the lead frame package 100 with housing 118. The lead frame package 100 features a first chip 110 disposed above a die attachment pad 108 and a second chip 114 disposed below the die attachment pad. The chip 110 is held in place using a clip having three connected parts 112*a*, 112*b*, and 112*c* (collectively, “clip 112”). The chip 114 is held in place using a clip having three connected parts 116*a*, 116*b*, and 116*c* (collectively, “clip 116”).

Part 112*a* is connected to part 112*b*, which is connected to part 112*c*, thus forming the clip 112. Part 112*a* of clip 112 is horizontally disposed and lays flat against the chip 110. Part 112*b* is a raised portion of clip 112, parallel to part 112*a*, and in a different plane than part 112*a*. Part 112*c* is vertically disposed and is connected to lead frame 104. In exemplary embodiments, part 112*a* of clip 112 is attached to chip 110 using low-temperature attachment material (LTAM). Further, in exemplary embodiments, chip 110 is attached to the die attachment pad 108 using LTAM and clip 112 is attached to lead frame 104 using LTAM.

Part 116*a* is connected to part 116*b*, which is connected to part 116*c*, thus forming the clip 116. Part 116*a* of clip 116 is horizontally disposed and lays flat against the chip 114. Part 116*b* is a lowered portion of clip 116, parallel to part 116*a*, and in a different plane than part 116*a*. Part 116*c* is vertically disposed and is connected to lead frame 104 (or, optionally, to a third lead frame not shown). In exemplary embodiments, part 116*a* of clip 116 is attached to chip 114 using high-temperature attachment material (HTAM). Further, in exemplary embodiments, chip 114 is attached to the die attachment pad 108 using HTAM and clip 116 is attached to lead frame 104 (or, optionally, to a third lead frame) using HTAM. In some embodiments, chip 110 and chip 114 are the same semiconductor devices, such as a TVS diode. In other embodiments, chip 110 is a first semiconductor device while chip 114 is a second, different semiconductor device.

In some embodiments, the high-temperature attachment material (HTAM) is an Ag sintering epoxy. In other embodiments, the HTAM is a high Pb solder. In still other embodiments, the HTAM is a transient liquid phase bonding (TLPS) solder. In some embodiments, the low-temperature attachment material (LTAM) is an SAC solder (tin, silver, and copper, or SnAgCu) Ag epoxy. In other embodiments, the LTAM is a high lead (Pb) solder while the HTAM is either a silver (Ag) sintering epoxy or a TLPS solder. Both LTAM and HTAM are conductive materials, with LTAM having a lower melting point than HTAM. In exemplary embodiments, when soldering/curing the LTAM, the HTAM does not remelt or dissolve. The silver content epoxy, such as Ag sintering epoxy, is special in that it can act as both LTAM and HTAM.

The lead frame package 100 features a lead frame 102 having three connected parts, 102*a*, 102*b*, and 102*c* (collectively, "lead frame 102"). Part 102*a* is connected to part 102*b*, which is connected to part 102*c*, thus forming lead frame 102. Part 102*a* is horizontally disposed and connected to a die attachment pad 108. Part 102*b* is vertically disposed, and part 102*c* is horizontally disposed, in a different plane from part 102*a* and parallel to part 102*a*. Part 102*c* is the part of lead frame 102 that is to be soldered to a printed circuit board (PCB).

The lead frame package 100 also features a lead frame 104 having three connected parts, 104*a*, 104*b*, and 104*c* (collectively, "lead frame 104"). Part 104*a* is connected to part 104*b*, which is connected to part 104*c*, thus forming lead frame 104. Part 104*a* is horizontally disposed and connects to the clips 112 and 116. Further, part 104*a* does not connect to the die attachment pad 108. Part 104*b* is vertically disposed, and part 104*c* is horizontally disposed, in a different plane from part 104*a* and parallel to part 104*a*. Part 104*c* is the part of lead frame 104 that is to be soldered to a PCB. The lead frame 102 and the lead frame 104 are partially outside the housing 118.

Optionally, the lead frame package 100 may include a third lead terminal (not shown) "behind" the lead frame 104. Like the lead frame 104, the third lead frame would also not be connected to the die attachment pad 108. Thus, only the first lead frame 102 connects to the die attachment pad 108.

The two-in-one package design of the lead frame package 100 enhances the power density of the protection device by supporting two semiconductor devices (the chips 110 and 114). This two-in-one design further allows the flexibility of having different product combinations housed in the same package, such as where chip 110 is different from chip 114. Finally, the two-in-one design allows a two-channel design for the chip, where one channel support chip 110 and the other channel supports chip 114. Existing lead frame packages feature a single chip/clip attachment on one lead frame side.

Figure 2A:
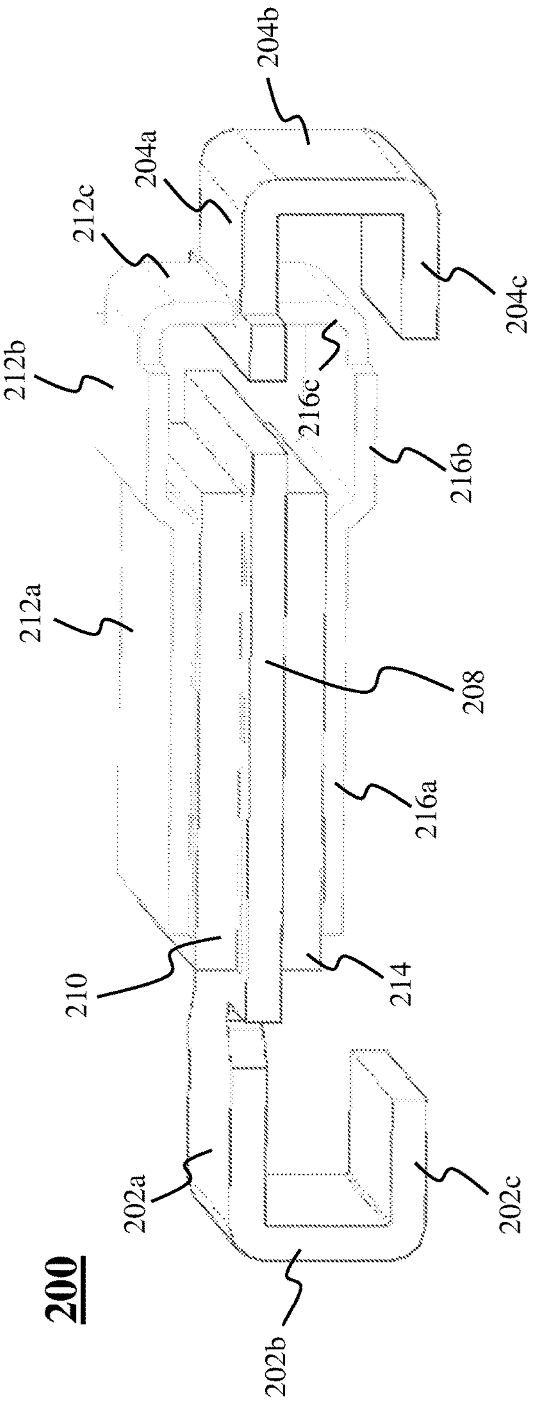
FIGS. 2A-2B are diagrams illustrating a lead frame package with two lead terminals, in accordance with exemplary embodiments.
Figure 2B:
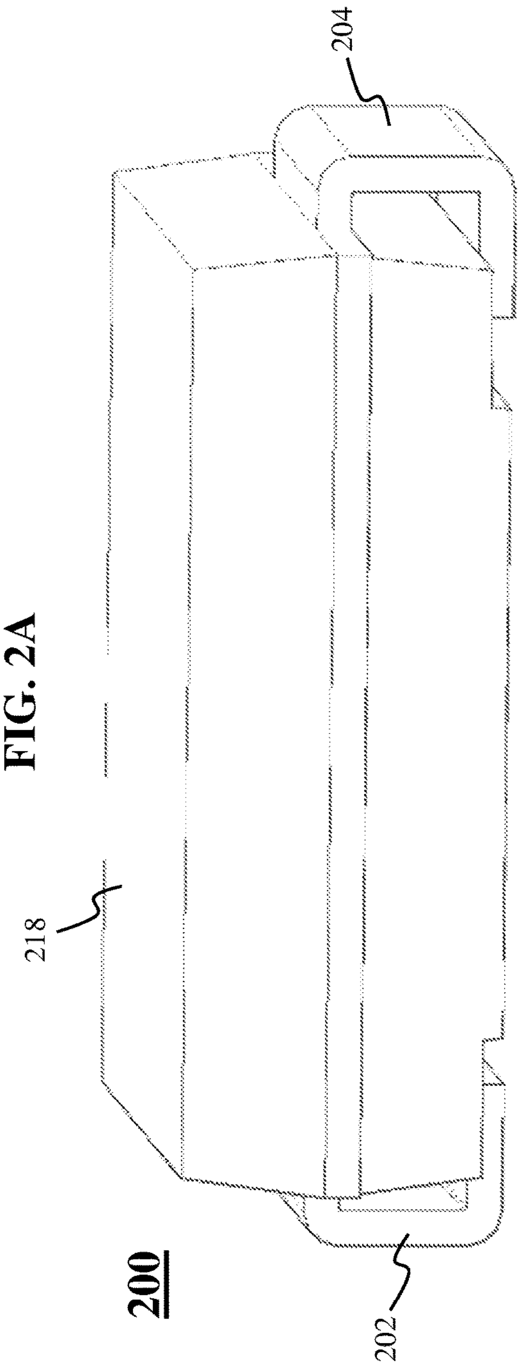

FIGS. 2A-2B are representative drawings of a lead frame package 200 for a TVS diode or other semiconductor device, according to exemplary embodiments. FIG. 2A is a perspective view of the lead frame package 200 and FIG. 2B is a perspective view of the lead frame package 200 with housing 218. The lead frame package 200 features two lead terminals, one of which connects to a die attachment pad while the other does not.

The lead frame package 200 features a first chip 210 disposed above a die attachment pad 208 and a second chip 214 disposed below the die attachment pad. The chip 210 is held in place using a clip having three connected parts 212*a*, 212*b*, and 212*c* (collectively, "clip 212"). The chip 214 is held in place using a clip having three connected parts 216*a*, 216*b*, and 216*c* (collectively, "clip 216"). In exemplary embodiments, the parts 216*a*, 216*b*, and 216*c* are formed as a unitary conductive material, such as zinc, copper, silver, aluminum, or alloys or combinations thereof. The present disclosure is not limited in this regard.

Part 212*a* is connected to part 212*b*, which is connected to part 212*c*, thus forming the clip 212. Part 212*a* of clip 212 is horizontally disposed and lays flat against the chip 210. Part 212*b* is a raised portion of clip 212, parallel to part 212*a*, and in a different plane than part 212*a*. Part 212*c* is vertically disposed and is connected to lead frame 204. In exemplary embodiments, part 212*a* of clip 212 is attached to chip 210 using LTAM. Further, in exemplary embodiments, chip 210 is attached to the die attachment pad 208 using LTAM and clip 212 is attached to lead frame 204 using LTAM.

Part 216*a* is connected to part 216*b*, which is connected to part 216*c*, thus forming the clip 216. Part 216*a* of clip 216 is horizontally disposed and lays flat against the chip 214. Part 216*b* is a lowered portion of clip 216, parallel to part 216*a*, and in a different plane than part 216*a*. Part 216*c* is vertically disposed and is connected to lead frame 204. In exemplary embodiments, part 216*a* of clip 216 is attached to chip 214 using HTAM. Further, in exemplary embodiments, chip 214 is attached to the die attachment pad 208 using HTAM and clip 216 is attached to lead frame 204 using HTAM. In some embodiments, chip 210 and chip 214 are the same semiconductor devices, such as a TVS diode. In other embodiments, chip 210 is a first semiconductor device while chip 214 is a second, different semiconductor device.

The lead frame package 200 features a lead frame 202 having three connected parts, 202*a*, 202*b*, and 202*c* (collectively, "lead frame 202"). Part 202*a* is connected to part 202*b*, which is connected to part 202*c*, thus forming lead frame 202. Part 202*a* is horizontally disposed and connected the lead frame 202 to the die attachment pad 208. Part 202*b* is vertically disposed, and part 202*c* is horizontally disposed, in a different plane from part 202*a* and parallel to part 202*a*. Part 202*c* is the part of lead frame 202 that is to be soldered to a PCB. The lead frame 202 and the lead frame 204 are partially outside the housing 218. In exemplary embodiments, the parts 202*a*, 202*b*, and 202*c* are formed as a unitary conductive material, such as zinc, copper, silver, aluminum, or alloys or combinations thereof. The present disclosure is not limited in this regard.

The lead frame package 200 also features a lead frame 204 having three connected parts, 204*a*, 204*b*, and 204*c* (collectively, "lead frame 204"). Part 204*a* is connected to part 204*b*, which is connected to part 204*c*, thus forming lead frame 204. Part 204*a* is horizontally disposed and connected to the clips 212 and 216. Part 204*b* is vertically disposed, and part 204*c* is horizontally disposed, in a different plane from part 204*a* and parallel to part 204*a*. Part 204*c* is the part of lead frame 204 that is to be soldered to a PCB.

Figure 3A:
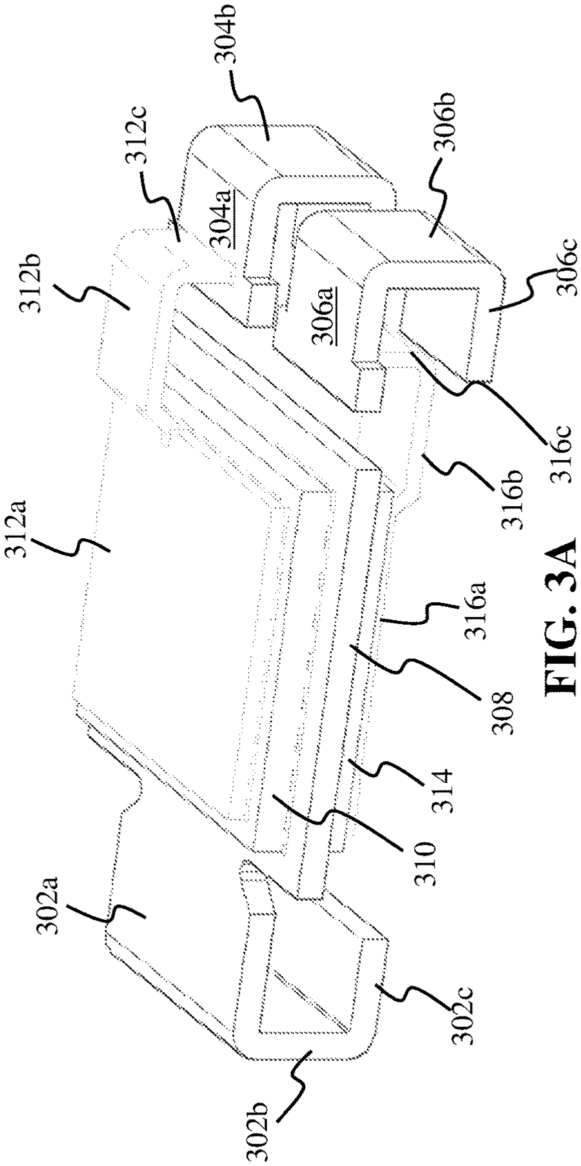
FIGS. 3A-3B are diagrams illustrating a lead frame package with three lead terminals, in accordance with exemplary embodiments.
Figure 3B:
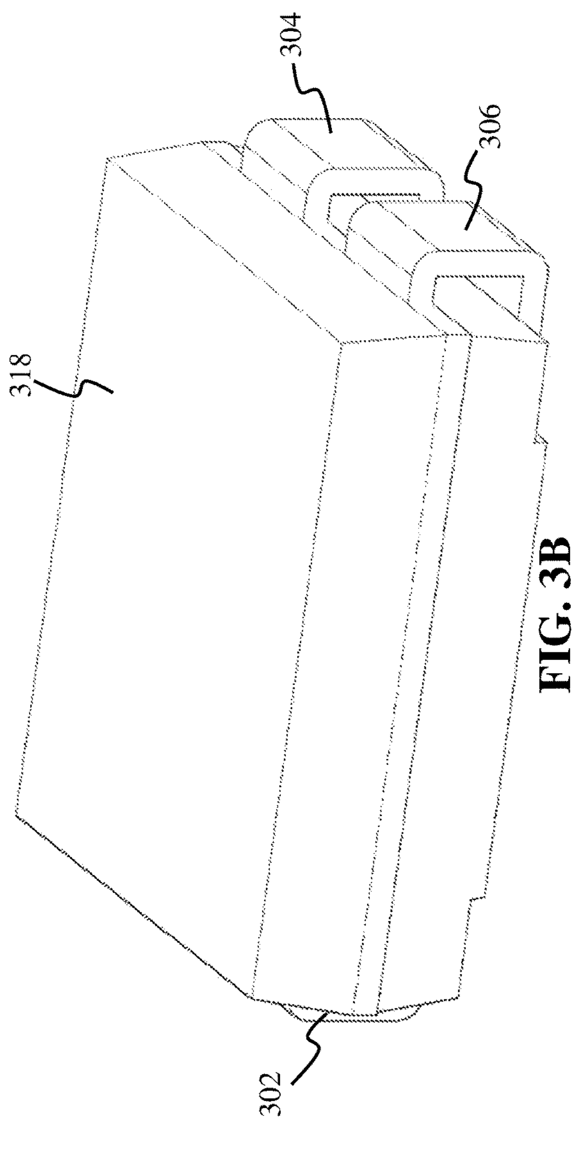

FIGS. 3A-3B are representative drawings of a lead frame package 300 for a TVS diode or other semiconductor device, according to exemplary embodiments. FIG. 3A is a perspective view of the lead frame package 300 and FIG. 3B is a perspective view of the lead frame package 300 with housing 318. The lead frame package 300 features three lead terminals, one of which connects to a die attachment pad while the other two do not.

The lead frame package 300 features a first chip 310 disposed above a die attachment pad 308 and a second chip 314 disposed below the die attachment pad. The chip 310 is held in place using a clip having three connected parts 312*a*, 312*b*, and 312*c* (collectively, "clip 312"). The chip 314 is held in place using a clip having three connected parts 316*a*, 316*b*, and 316*c* (collectively, "clip 316"). In exemplary embodiments, the parts 316*a*, 316*b*, and 316*c* are formed as a unitary conductive material, such as zinc, copper, silver, aluminum, or alloys or combinations thereof. The present disclosure is not limited in this regard.

Part 312*a* is connected to part 312*b*, which is connected to part 312*c*, thus forming the clip 312. Part 312*a* of clip 312 is horizontally disposed and lays flat against the chip 310. Part 312*b* is a raised portion of clip 312, parallel to part 312*a*, and in a different plane than part 312*a*. Part 312*c* is vertically disposed and is connected to lead frame 304. In exemplary embodiments, part 312*a* of clip 312 is attached to chip 310 using LTAM. Further, in exemplary embodiments, chip 310 is attached to the die attachment pad 308 using LTAM and clip 312 is attached to lead frame 304 using LTAM.

Part 316*a* is connected to part 316*b*, which is connected to part 316*c*, thus forming the clip 316. Part 316*a* of clip 316 is horizontally disposed and lays flat against the chip 314. Part 316*b* is a lowered portion of clip 316, parallel to part 316*a*, and in a different plane than part 316*a*. Part 316*c* is vertically disposed and is connected to lead frame 306. In exemplary embodiments, part 316*a* of clip 316 is attached to chip 314 using HTAM. Further, in exemplary embodiments, chip 314 is attached to the die attachment pad 308 using HTAM and clip 316 is attached to lead frame 306 using HTAM. In some embodiments, chip 310 and chip 314 are the same semiconductor devices, such as a TVS diode. In other embodiments, chip 310 is a first semiconductor device while chip 314 is a second, different semiconductor device.

In contrast to the lead frame package 200, which has two lead frames 202 and 204, the lead frame package 300 has three lead frames 302, 304, and 306. The lead frame package 300 features a lead frame 302 having three connected parts, 302*a*, 302*b*, and 302*c* (collectively, "lead frame 302"). Part 302*a* is connected to part 302*b*, which is connected to part 302*c*, thus forming lead frame 302. Part 302*a* is horizontally disposed and connects the lead frame 302 to the die attachment pad 308. Part 302*b* is vertically disposed, and part 302*c* is horizontally disposed, in a different plane from part 302*a* and parallel to part 302*a*. Part 302*c* is the part of lead frame 302 that is to be soldered to a PCB.

The lead frame package 300 also features a lead frame 304 having three connected parts, 304*a*, 304*b*, and 304*c* (collectively, "lead frame 304"). Part 304*a* is connected to part 304*b*, which is connected to part 304*c*, thus forming lead frame 304. Part 304*a* is horizontally disposed and connected to the clip 312. Part 304*b* is vertically disposed, and part 304*c* is horizontally disposed, in a different plane from part 304*a* and parallel to part 304*a*. Part 304*c* is the part of lead frame 304 that is to be soldered to a PCB. The lead frame 302, the lead frame 304, and the lead frame 306 are partially outside the housing 318. In exemplary embodiments, the parts 302*a*, 302*b*, and 302*c* are formed as a unitary conductive material, such as zinc, copper, silver, aluminum, or alloys or combinations thereof. The present disclosure is not limited in this regard.

The lead frame package 300 also features a lead frame 306 having three connected parts, 306*a*, 306*b*, and 306*c* (collectively, "lead frame 306"), with lead frame 306 being adjacent to lead frame 304. Part 306*a* is connected to part 306*b*, which is connected to part 306*c*, thus forming lead frame 306. Part 306*a* is horizontally disposed and connected to the clip 316. Part 306*b* is vertically disposed, and part 306*c* is horizontally disposed, in a different plane from part 306*a* and parallel to part 306*a*. Part 306*c* is the part of lead frame 306 that is to be soldered to a PCB.

Figure 4A:
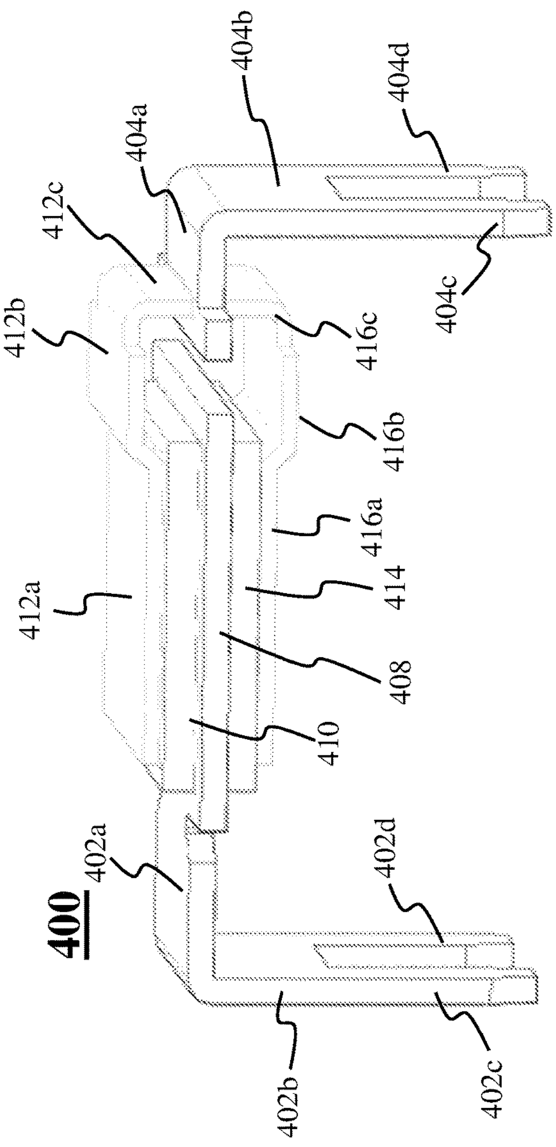
FIGS. 4A-4B are diagrams illustrating a lead frame package with two DIP-type lead frame terminals, in accordance with exemplary embodiments.
Figure 4B:
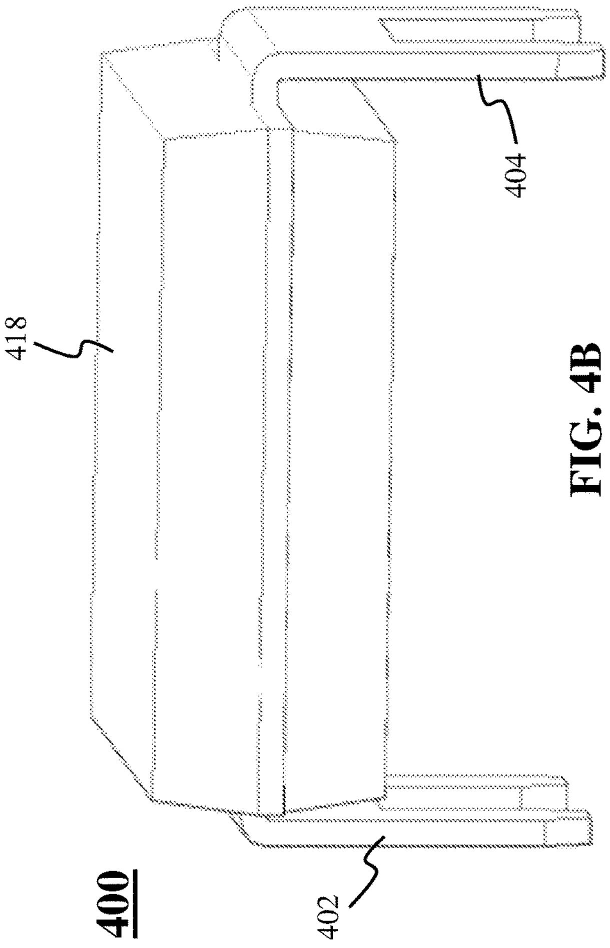

FIGS. 4A-4B are representative drawings of a lead frame package 400 for a TVS diode or other semiconductor device, according to exemplary embodiments. FIG. 4A is a perspective view of the lead frame package 400 and FIG. 4B is a perspective view of the lead frame package 400 with housing 418. The lead frame package 400 features two lead terminals, one of which connects to a die attachment pad and the other of which does not.

In contrast to the lead frame packages 100, 200, and 300, the lead frames of the lead frame package 400 resemble lead frames of dual inline packages (DIPs). Thus, the lead frames are known herein as DIP-type lead frames. The lead frame packages 100, 200, and 300 may be thought of as surface mount-type packages while the lead frame package 400 (and the lead frame package 500, described below) may be thought of as DIP-type packages.

The lead frame package 400 features a first chip 410 disposed above a die attachment pad 408 and a second chip 414 disposed below the die attachment pad. The chip 410 is held in place using a clip having three connected parts 412*a*, 412*b*, and 412*c* (collectively, "clip 412"). The chip 414 is held in place using a clip having three connected parts 416*a*, 416*b*, and 416*c* (collectively, "clip 416"). In exemplary embodiments, the parts 416*a*, 416*b*, and 416*c* are formed as a unitary conductive material, such as zinc, copper, silver, aluminum, or alloys or combinations thereof. The present disclosure is not limited in this regard.

Part 412*a* is connected to part 412*b*, which is connected to part 412*c*, thus forming the clip 412. Part 412*a* of clip 412 is horizontally disposed and lays flat against the chip 410. Part 412*b* is a raised portion of clip 412, parallel to part 412*a*, and in a different plane than part 412*a*. Part 412*c* is vertically disposed and is connected to DIP-type lead frame 404. In exemplary embodiments, part 412*a* of clip 412 is attached to chip 410 using LTAM. Further, in exemplary embodiments, chip 410 is attached to the die attachment pad 408 using LTAM and clip 412 is attached to lead frame 404 using LTAM.

Part 416*a* is connected to part 416*b*, which is connected to part 416*c*, thus forming the clip 416. Part 416*a* of clip 416 is horizontally disposed and lays flat against the chip 414. Part 416*b* is a lowered portion of clip 416, parallel to part 416*a*, and in a different plane than part 416*a*. Part 416*c* is vertically disposed and is connected to DIP-type lead frame 404. In exemplary embodiments, part 416*a* of clip 416 is attached to chip 414 using HTAM. Further, in exemplary embodiments, chip 414 is attached to the die attachment pad 408 using HTAM and clip 416 is attached to lead frame 404 using HTAM. In some embodiments, chip 410 and chip 414 are the same semiconductor devices, such as a TVS diode. In other embodiments, chip 410 is a first semiconductor device while chip 414 is a second, different semiconductor device.

The lead frame package 400 features a DIP-type lead frame 402 having four connected parts, 402*a*, 402*b*, 402*c*, and 402*d* (collectively, "DIP-type lead frame 402"). Part 402*a* is connected to part 402*b*, which is connected to parts 402*c* and 402*d*, thus forming DIP-type lead frame 402. Part 402*a* is horizontally disposed and connects the lead frame 402 to the die attachment pad 408. Parts 402*b*, 402*c*, and 402*d* are vertically disposed (orthogonal to part 402*a*), with parts 402*c* and 402*d* extending downward from part 402*b*. Parts 402*c* and 402*d* are the parts of DIP-type lead frame 402 that are to be soldered to a PCB. The lead frame 402 and the lead frame 404 are partially outside the housing 418. In exemplary embodiments, the parts 402*a*, 402*b*, and 402*c* are formed as a unitary conductive material, such as zinc, copper, silver, aluminum, or alloys or combinations thereof. The present disclosure is not limited in this regard.

The lead frame package 400 also features a DIP-type lead frame 404 having four connected parts, 404*a*, 404*b*, 402*c*, and 402*d* (collectively, "DIP-type lead frame 404"). Part 404*a* is connected to part 404*b*, which is connected to parts 404*c* and 404*d*, thus forming DIP-type lead frame 404. Part 404*a* is horizontally disposed and connected to the clips 412 and 416. Parts 404*b*, 404*c*, and 404*d* are vertically disposed (orthogonal to part 404*a*), with parts 404*c* and 404*d* extending downward from part 404*b*. Parts 404*c* and 404*d* are the parts of DIP-type lead frame 404 that are to be soldered to a PCB.

Figure 5A:
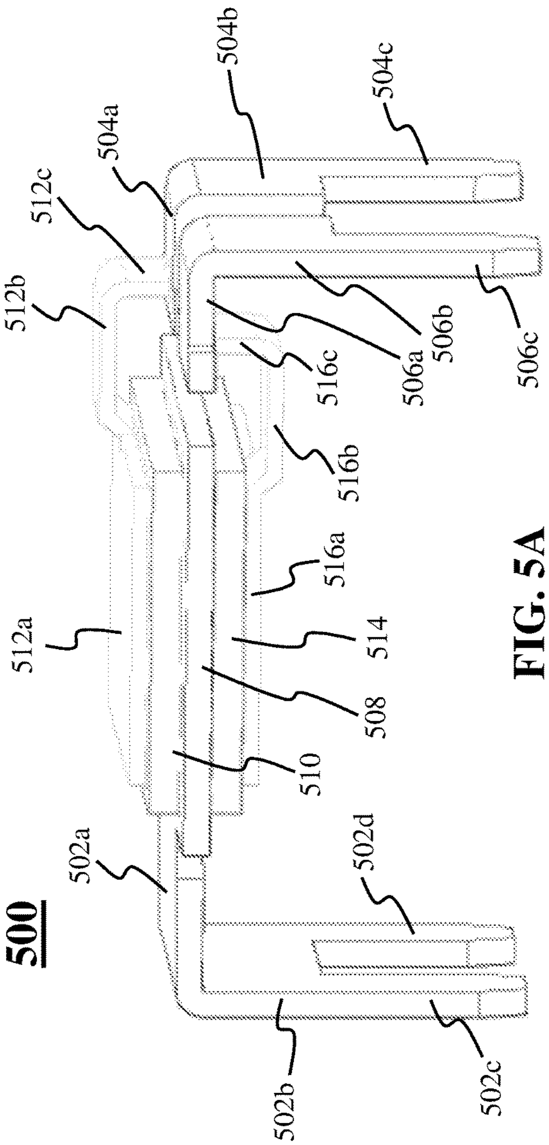
FIGS. 5A-5B are diagrams illustrating a lead frame package three DIP-type lead frame terminals, in accordance with exemplary embodiments.
Figure 5B:
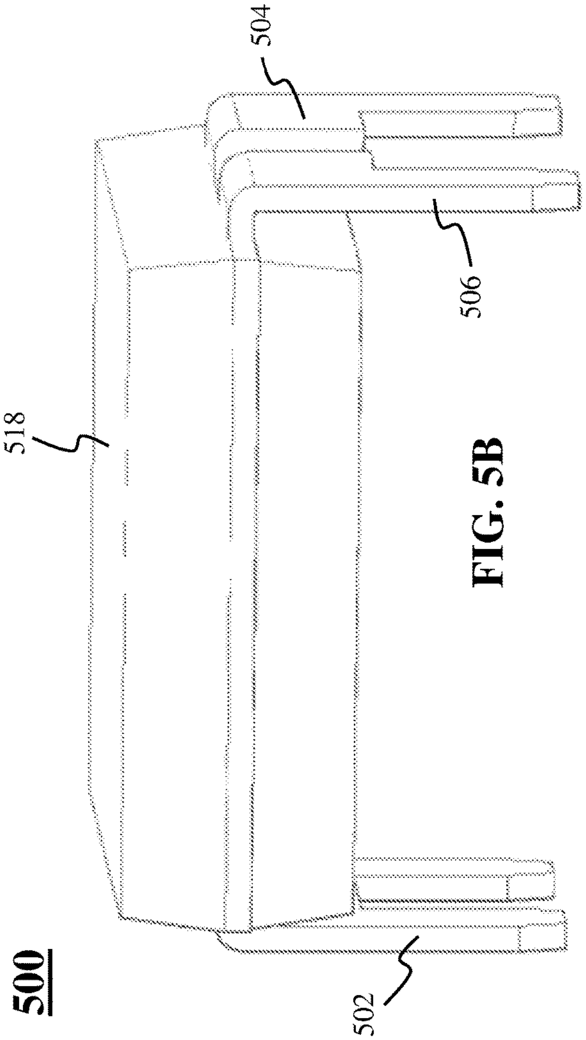

FIGS. 5A-5B are representative drawings of a lead frame package 500 for a TVS diode or other semiconductor device, according to exemplary embodiments. FIG. 5A is a perspective view of the lead frame package 500 and FIG. 5B is a perspective view of the lead frame package 500 with housing 518. The lead frame package 500 features three lead terminals, one of which connects to a die attachment pad while the other two do not. Like the lead frame package 400, the lead frames of the lead frame package 500 are DIP-type lead frames. The lead frame 502 and the lead frame 504 are partially outside the housing 518.

The lead frame package 500 features a first chip 510 disposed above a die attachment pad 508 and a second chip 514 disposed below the die attachment pad. The chip 510 is held in place using a clip having three connected parts 512*a*, 512*b*, and 512*c* (collectively, "clip 512"). The chip 514 is held in place using a clip having three connected parts 516*a*, 516*b*, and 516*c* (collectively, "clip 516"). In exemplary embodiments, the parts 516*a*, 516*b*, and 516*c* are formed as a unitary conductive material, such as zinc, copper, silver, aluminum, or alloys or combinations thereof. The present disclosure is not limited in this regard.

Part 512*a* is connected to part 512*b*, which is connected to part 512*c*, thus forming the clip 512. Part 512*a* of clip 512 is horizontally disposed and lays flat against the chip 510. Part 512*b* is a raised portion of clip 512, parallel to part 512*a*, and in a different plane than part 512*a*. Part 512*c* is vertically disposed and is connected to DIP-type lead frame 504. In exemplary embodiments, part 512*a* of clip 512 is attached to chip 510 using LTAM. Further, in exemplary embodiments, chip 510 is attached to the die attachment pad 508 using LTAM and clip 512 is attached to lead frame 504 using LTAM.

Part 516*a* is connected to part 516*b*, which is connected to part 516*c*, thus forming the clip 516. Part 516*a* of clip 516 is horizontally disposed and lays flat against the chip 514. Part 516*b* is a lowered portion of clip 516, parallel to part 516*a*, and in a different plane than part 516*a*. Part 516*c* is vertically disposed and is connected to DIP-type lead frame 506. In exemplary embodiments, part 516*a* of clip 516 is attached to chip 514 using HTAM. Further, in exemplary embodiments, chip 514 is attached to the die attachment pad 508 using HTAM and clip 516 is attached to lead frame 506 using HTAM. In some embodiments, chip 510 and chip 514 are the same semiconductor devices, such as a TVS diode. In other embodiments, chip 510 is a first semiconductor device while chip 514 is a second, different semiconductor device.

The lead frame package 500 features a DIP-type lead frame 502 having four connected parts, 502*a*, 502*b*, 502*c*, and 502*d* (collectively, "DIP-type lead frame 502"). Part 502*a* is connected to part 502*b*, which is connected to parts 502*c* and 502*d*, thus forming DIP-type lead frame 502. Part 502*a* is horizontally disposed and connects the lead frame 502 to the die attachment pad 508. Parts 502*b*, 502*c*, and 502*d* are vertically disposed (orthogonal to part 502*a*), with parts 502*c* and 502*d* extending downward from part 502*b*. Parts 502*c* and 502*d* are the parts of DIP-type lead frame 502 that are to be soldered to a PCB.

The lead frame package 500 also features a DIP-type lead frame 504 having four connected parts, 504*a*, 504*b*, 502*c*, and 502*d* (collectively, "DIP-type lead frame 504"). Part 504*a* is connected to part 504*b*, which is connected to parts 504*c* and 504*d*, thus forming DIP-type lead frame 504. Part 504*a* is horizontally disposed and connected to the clip 512. Parts 504*b*, 504*c*, and 504*d* are vertically disposed (orthogonal to part 504*a*), with parts 504*c* and 504*d* extending downward from part 504*b*. Parts 504*c* and 504*d* are the parts of DIP-type lead frame 504 that are to be soldered to a PCB. In exemplary embodiments, the parts 502*a*, 502*b*, and 502*c* are formed as a unitary conductive material, such as zinc, copper, silver, aluminum, or alloys or combinations thereof. The present disclosure is not limited in this regard.

The lead frame package 500 also features a DIP-type lead frame 506 having four connected parts, 506*a*, 506*b*, 506*c*, and 506*d* (collectively, "DIP-type lead frame 506"), with lead frame 506 being adjacent to lead frame 504. Part 506*a* is connected to part 506*b*, which is connected to parts 506*c* and 506*d*, thus forming DIP-type lead frame 506. Part 506*a* is horizontally disposed and connected to the clip 516. Parts 506*b*, 506*c*, and 506*d* are vertically disposed (orthogonal to part 506*a*), with parts 506*c* and 506*d* extending downward from part 506*b*. Parts 506*c* and 506*d* are the parts of DIP-type lead frame 506 that are to be soldered to a PCB.

Like the lead frame package 100, the lead frame packages 200, 300, 400, and 500 enhance the power density of the protection device by supporting two semiconductor devices, allowing the flexibility of having different product combinations housed in the same package, and allows a two-channel design for the chips. The lead frame package 100 may feature two or three lead frames, the lead frame package 200 features two lead frames, the lead frame package 300 features three lead frames, the lead frame package 400 features two DIP-type lead frames, and the lead frame package 500 features three DIP-type lead frames. Semiconductor device combinations such as TVS+TVS, TVS+triac, TVS+thyristor, TVS+diode, are possible using any of the lead frame packages 100, 200, 300, 400, or 500.

As further alternatives, the lead frame packages 100, 200, 300, 400, or 500 may be modified so that a single clip is used to secure the semiconductor device (e.g., chips 110/114, 210/214, 310/314, 410/414, or 510/514) using either HTAM or LTAM while the other semiconductor device is secured using wire bonding. Or the lead frame packages 100, 200, 300, 400, or 500 may feature a semiconductor device, such as TVS, triac, thyristor, SIDACtor, or diode on one side of the package and a polymeric positive temperature coefficient (PPTC) device on the other side of the package. In an exemplary embodiment, two identical TVS chips are assembled into a lead frame package using HTAM (Pb92.5Sn5Ag2.5 solder) and LTAM (SAC305 solder) and using DIP-type lead frames.

Figure 6:
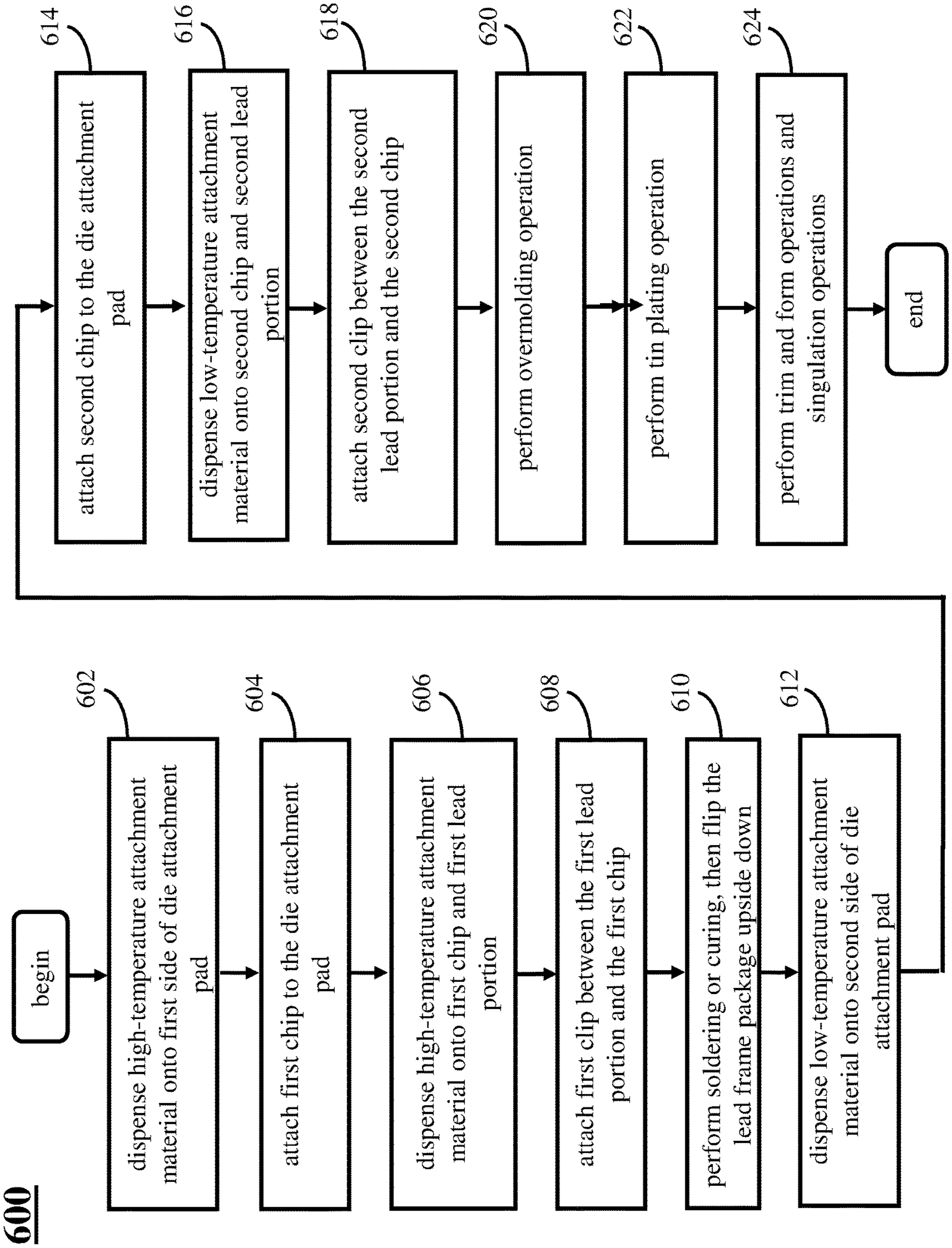
FIG. 6 is a flow diagram illustrating a lead frame package assembly process, in accordance with exemplary embodiments.

FIG. 6 is a representative flow diagram of a lead frame package assembly process 600, according to exemplary embodiments. The lead frame package assembly process 600 may be used to assemble any of the lead frame packages 100, 200, 300, 400, or 500 disclosed herein. The high-temperature attachment material is dispensed onto a first side of the die attachment pad (block 602). The first chip is then attached to the first side of the die attachment pad (block 604). The HTAM is then dispensed onto the first chip as well as a lead portion (block 606), where the lead portion is that portion of the lead (e.g., 104*a*, 204*a*, 304*a*, 404*a*, 504*a*) that is to be attached to the clip (e.g., 112, 212, 312, 412, 512). The first clip is then attached to the first chip and to the lead portion (block 608).

Soldering or curing is performed, after which the lead frame package assembly is flipped upside down (block 610). The HTAM solder should not be melted when the LTAM soldering/curing is occurring. The LTAM is then used to replace high-temperature attachment material for the second clip and the second clip joint. LTAM is dispensed onto the second side of the die attachment pad (block 612). The second chip is attached to the second side of the die attachment pad (block 614). The LTAM is also dispensed onto the second chip as well as a second lead portion (block 616). The second clip is then attached between the second lead portion and the second chip (block 618). An overmolding operation is then performed (block 620), followed by tin plating (block 622) and trim and form operations as well as singulation operations (block 624). The lead frame package assembly process is thus complete.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A lead frame package comprising:

a first semiconductor chip disposed above and coupled to a die attachment pad using a first clip;

a second semiconductor chip disposed below and coupled to the die attachment pad using a second clip, wherein the die attachment pad is sandwiched between the first semiconductor chip and the second semiconductor chip;

a first lead frame coupled to the die attachment pad;

a second lead frame coupled to the first clip, wherein the second lead frame is not coupled to any clip disposed below the die attachment pad; and a third lead frame adjacent to the second lead frame and coupled to the second clip, wherein the third lead frame is not coupled to any clip disposed above the die attachment pad.

2. The lead frame package of claim 1, wherein the second lead frame is not coupled to the die attachment pad.

3. The lead frame package of claim 1, wherein the third lead frame is not coupled to the die attachment pad.

4. The lead frame package of claim 1, further comprising a housing inside which the first semiconductor chip and the second semiconductor chip are disposed, wherein the first lead frame, the second lead frame, and the third lead frame are partially outside the housing.

5. The lead frame package of claim 1, wherein the first clip is attached to the first semiconductor chip using a high-temperature attachment material.

6. The lead frame package of claim 5, wherein the second clip is attached to the second semiconductor chip using a low-temperature attachment material.

7. The lead frame package of claim 1, wherein the first lead frame and the second lead frame are surface mount lead frames.

8. The lead frame package of claim 1, wherein the first lead frame and the second lead frame are dual inline package lead frames.

9. The lead frame package of claim 1, wherein the first clip has a first part coupled to the first semiconductor chip and a second part coupled to the second lead frame.

10. The lead frame package of claim 1, wherein the second clip has a first part coupled to the second semiconductor chip and a second part coupled to the third lead frame.

11. The lead frame package of claim 1, wherein the second lead frame and the third lead frame provide a two-channel design for the first semiconductor chip and the second semiconductor chip.

* * * * *